United States Patent
Zink

(10) Patent No.: US 8,101,930 B2
(45) Date of Patent: Jan. 24, 2012

(54) METHOD OF INCREASING THE OPERATION LIFETIME OF A COLLECTOR OPTICS ARRANGED IN AN IRRADIATION DEVICE

(75) Inventor: Peter Zink, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 63 days.

(21) Appl. No.: 12/743,821

(22) PCT Filed: Nov. 19, 2008

(86) PCT No.: PCT/IB2008/054845
§ 371 (c)(1),
(2), (4) Date: May 20, 2010

(87) PCT Pub. No.: WO2009/066242
PCT Pub. Date: May 28, 2009

(65) Prior Publication Data
US 2010/0282986 A1 Nov. 11, 2010

(30) Foreign Application Priority Data
Nov. 22, 2007 (EP) ..................................... 07121264

(51) Int. Cl.
*G21K 5/04* (2006.01)
*H05G 2/00* (2006.01)

(52) U.S. Cl. ............. 250/504 R; 250/491.1; 250/493.1; 250/505.1; 250/515.1; 378/34; 378/119

(58) Field of Classification Search ............. 250/370.09, 250/372, 491.1, 492.1, 493.1, 803.1, 505.1, 250/515.1, 504 R; 378/34, 119
See application file for complete search history.

(56) References Cited

U.S. PATENT DOCUMENTS
4,408,338 A 10/1983 Grobman
(Continued)

FOREIGN PATENT DOCUMENTS
WO 2006134512 A2 12/2006
(Continued)

OTHER PUBLICATIONS

"Liquid Cleaning of Mirror Optics"; Research Disclosure, Mason Publications, Hampshire, Great Britain, vol. 513, No. 6, 2 Page Document.

*Primary Examiner* — Bernard E Souw

(57) ABSTRACT

The present invention relates to a method of increasing the operation lifetime of an optical collector unit (33)) arranged in an irradiation device. The irradiation device at least comprises a radiation source (1) emitting optical radiation, in particular extreme ultraviolet radiation or soft X-rays, said radiation source (1) generating substances and/or particles colliding with optical surfaces of the optical collector unit (33), which forms a radiation beam of a portion of said radiation emitted by said radiation source (1), and a debris mitigation unit (37) arranged between the radiation source (1) and said optical collector unit (33). In the proposed method the optical collector unit (33) is moved during operation and/or in operation pauses of the device such that deposits or degradation effects caused by collision of said substances and/or particles with said optical surfaces of the collector unit (33) are distributed more homogeneously on said optical surfaces than without such a movement. With the method and the corresponding device the optical surfaces of the collection unit are degraded more homogeneously resulting in an increased lifetime of the collector unit.

5 Claims, 3 Drawing Sheets

U.S. PATENT DOCUMENTS

| | | |
|---|---|---|
| 6,339,634 B1 | 1/2002 | Kandaka et al. |
| 6,946,669 B2 | 9/2005 | Kleinschmidt |
| 7,079,224 B2 * | 7/2006 | Tran et al. ............. 355/67 |
| 7,230,258 B2 * | 6/2007 | Ruzic et al. ............ 250/504 R |
| 7,652,272 B2 * | 1/2010 | Ruzic et al. ............ 250/504 R |
| 2002/0090054 A1 | 7/2002 | Sogard |
| 2005/0139785 A1 * | 6/2005 | Banine et al. ............ 250/492.2 |
| 2006/0160031 A1 * | 7/2006 | Wurm et al. ............ 430/322 |
| 2006/0175558 A1 | 8/2006 | Bakker et al. |
| 2006/0203965 A1 | 9/2006 | Zink |
| 2006/0261290 A1 * | 11/2006 | Van Herpen et al. ...... 250/492.2 |
| 2007/0058244 A1 | 3/2007 | Singer |
| 2007/0069160 A1 | 3/2007 | Banine et al. |
| 2008/0237501 A1 * | 10/2008 | Hosokai et al. ............ 250/504 R |
| 2009/0127479 A1 * | 5/2009 | Hosokai et al. ............ 250/504 R |
| 2010/0091941 A1 * | 4/2010 | Zocchi et al. ............ 378/34 |

FOREIGN PATENT DOCUMENTS

| | | |
|---|---|---|
| WO | 2006136967 A2 | 12/2006 |
| WO | 2007051537 A2 | 5/2007 |

\* cited by examiner

METHOD OF INCREASING THE OPERATION LIFETIME OF A COLLECTOR OPTICS ARRANGED IN AN IRRADIATION DEVICE

FIELD OF THE INVENTION

The present invention relates to a method of increasing the operation lifetime of an optical collector unit arranged in an irradiation device, said irradiation device at least comprising a radiation source emitting optical radiation, in particular extreme ultraviolet radiation (EUV) and/or soft X-rays, said radiation source generating substances and/or particles colliding with optical surfaces of said optical collector unit, the optical collector unit which forms a radiation beam of a portion of said optical radiation emitted by said radiation source and a debris mitigation unit arranged between said radiation source and said optical collector unit. The invention also relates to an irradiation device with an optical collector unit adapted to perform the proposed method.

BACKGROUND OF THE INVENTION

In the field of optical lithography for semiconductor industry complex optics are used in order to ensure the required imaging quality. This applies in particular to EUV lithography, i.e. lithography with extreme ultraviolet radiation, in which grazing incidence mirrors and/or multilayer mirrors are arranged in a vacuum chamber between the light source, also referred to as radiation source, and the wafer substrate to be exposed. For developing high power light sources especially for application in EUV lithography the use of metallic radiating material like e.g. Sn and Li is mandatory to reach high efficiencies for the conversion of input power—electrical power for discharge plasma sources or laser power for laser produced plasmas—into EUV radiation.

An implicit problem when using such materials is that these materials will condense on the collector optics which is necessarily placed close to the light source in the same vacuum system to collect the emitted light. The substances or materials released from the light source and moving in the direction of the collector optics are also called debris. Debris layers can deposit on the reflecting surfaces of the collector optics reducing the quality of the optical surfaces. Already very thin deposited layers significantly reduce the reflected intensity of the EUV radiation due to absorption losses on the reflecting surfaces. The amount of material passing from the light source to the reflecting surfaces of the collector optics can be strongly reduced when using debris mitigation devices between the light source and the collector optics, but will never be zero. U.S. 2006/0203965 A1 discloses a device for and method of generating extreme ultraviolet and/or soft X-ray radiation by means of a plasma in which a reduction in the contamination of the optical surfaces is achieved by using an appropriate debris mitigation device.

The deposition of debris will not necessarily be homogeneous over the reflecting surfaces of the optical device, because the emission of theses substances from the radiation source is not necessarily isotropic and also the debris mitigation device has not necessarily the same mitigation efficiencies in all directions. This results in regions on the reflecting surfaces of the collector optics which will degrade faster than others. The operation lifetime of the collector optics will then be shorter compared to a homogeneous deposition because it is defined by the lifetime of the worst region, where the deposition is highest. Already before reaching the end of life criteria for the worst region, the homogeneity of illumination will be affected leading to reduced performance of the illumination system or to reduced throughput if light has to be thrown away to reach homogeneous illumination on a lower level.

Next to deposition of debris material the performance and lifetime of the collector optics is affected by fast particles and ions impinging on the reflecting surfaces of the optical device. This can lead to sputtering of collector material, to roughening or splashing of the coating or to intermixing of adjacent layers if multilayers are used for coating of the collector optics. All these effects lead to reduced reflectivity for the concerned regions of the reflecting surfaces. Also in this case, the exposure of the reflecting surfaces is not homogeneous and some regions might be more affected than others. This leads again to homogeneity problems for the further illumination in the lithographic process and to a reduced throughput and reduced lifetime of the collector optics compared to a homogeneous exposure of the reflecting surfaces.

In order to overcome the above problems the plasma pinch in case of a plasma based light source may be optimized to lead an as much as possible isotropic emission of debris material. Furthermore, the debris mitigation device may be designed to have the same mitigation efficiency for all for the light collection relevant directions or even to have a dedicated design of debris mitigation which corrects for a non isotropic debris emission of the radiation source leading to a homogeneous situation for all the relevant directions after the debris mitigation.

SUMMARY OF THE INVENTION

It is an object of the present invention to provide an additional method to increase the operation lifetime of the optical collector unit of an irradiation device, in particular of an irradiation device emitting EUV radiation or soft X-rays, and to provide an appropriate illumination device which allows the proposed method to be performed.

This object is achieved with the method and device according to present claims 1. Advantageous embodiments of the method and device are subject of the dependent claims and are furthermore described in the following description and examples for carrying out the invention.

The proposed method increases the operation lifetime of the optical collector unit arranged in an irradiation device, which irradiation device at least comprises a radiation source emitting optical radiation, in particular extreme ultraviolet radiation or soft X-rays, and generating substances and/or particles colliding with optical surfaces of said optical collector unit. These substances and/or particles are referred to as debris in the present specification and may be formed for example of evaporated liquid or solid material necessary for a generating a radiating plasma or from fast atoms, molecules, ions or electrons generated during operation of the radiation source. The optical collector unit comprises one or several reflecting surfaces forming a radiation beam of a portion of said radiation emitted by the radiation source and may for example be formed of one or several grazing incidence mirrors and/or multilayer mirrors. In this irradiation device also at least one debris mitigation unit is arranged, typically between the radiation source and the optical collector unit, in order to reduce an amount of said substances and/or particles which collide with optical surfaces of the collector unit. In the proposed method the collector unit is moved during operation and/or in operation pauses of the device such that deposits or degradation effects caused by collision of said substances and/or particles with said optical surfaces of the collector unit are distributed more homogeneously on said optical surfaces than without such a movement.

The proposed irradiation device which allows to perform the proposed method correspondingly comprises the above mentioned components, i.e. the radiation source, the optical collector unit and the debris mitigation unit, and is characterized in that the optical collector unit is mounted on a driving unit which is arranged and designed to move, in particular rotate and/or translate, said optical collector unit in the above mentioned manner.

With the proposed method an inhomogeneous degradation of the reflecting surfaces of the collector unit is avoided or at least significantly reduced by moving the collector unit in an appropriate manner. Looking on the lifetime target for such a collector unit which is in the range of one year, the homogenization can be achieved already by relatively slow motion of the collector unit which results in a spreading of the degradation over the whole optical surface. Due to the averaging effect over time this leads to a more homogeneous degradation of the one or several optical surfaces and therefore to an increased operation lifetime of the collector unit.

The way of moving the collector unit, which may also be composed of several independent components which then can be moved independently, has to be adapted to the geometry of the irradiation device, especially to the geometry of the light path and to the special inhomogeneities of the debris emission. As already stated above, debris can be both material or substances which are emitted from the radiation source and deposited on the optical surfaces, and energetic neutral or charged particles which cause sputtering or other kinds of surface degradation of the optical surfaces.

In principle, the collector unit can be moved using different kinds of movements. A first kind of movement keeps the geometry of the light path and can therefore be done during operation of the irradiation device, which may also be a lithographic tool, or in short operation pauses, but leading to the correct geometry of the light path for the next operation period. Such movements are mainly but not exclusively based on a rotation of the collector unit around its optical axis. This optical axis typically also passes through the plasma pinch of the radiation source, when using a plasma based radiation source, and through the so called intermediate focus of the irradiation device where the collected light is focused to. The collector unit consisting of one or more pieces or components has to be rotational symmetric with respect to the optical axis. If this symmetry is accomplished for all angles, the rotation can be performed either continuous or intermittently or stepwise during operation or in arbitrary steps during operation pauses. If the symmetry is discrete for special angles, which are e.g. defined by a holding structure of the collector unit, the rotation should be performed only in operation pauses and only by multiples of the discrete angle. In this way it is assured that the light path and the shadow patterning due to holding structures are always the same. With these rotations a homogenization is achieved if the debris exposure of the collector unit is not homogeneous with respect to the azimuthally angle around the optical axis, which is a case of special importance. Due to the rotation different areas are exposed to different strong debris load which leads to an averaging over the different angular regions of the collector unit and therefore to a more homogeneous distribution of the debris.

In special cases there may exist angular regions of the collector unit where deposition of material is dominating while in other angular regions sputtering is dominant. Due to the rotation of the collector unit in such a case regions with depositions become afterwards regions with sputtering so that the deposition is removed again by this sputtering. This also results in an improvement of homogeneity and operation lifetime of the collector unit.

The idea to remove debris induced depositions by debris induced sputtering in a preferred embodiment can be used in general to improve the homogeneity and lifetime of the collector unit due to the movement of the collector unit relative to the radiation source. In operation pauses, where also changes of the position of the collector unit relative to the light source are possible which lead to a change of the light path not acceptable during exposure of wafers, i.e. during normal operation of the device, the collector unit can be moved in such a way relative to the radiation source in each direction, that regions where deposition was dominant during normal operation are now regions where sputtering becomes dominant. In this embodiment, the radiation source has to be operated also in the above operation pauses of the device or lithographic tool, in which the reflected light is not used and can also be blocked if necessary. The operation of the radiation source is necessary for the sputtering effect.

In addition or instead of the rotating movement of the collector unit it is also possible to perform a translational movement. The movements can be realized in different ways depending on whether the movement is such a translation in direction of the optical axis or perpendicular to it or whether a rotation is necessary in which case standard mechanical solutions compatible with the vacuum environment can be applied. Of course the position stability and position reversibility of the optical collector unit has to be assured to keep the optical performance of the device.

In order to perform the movement of the collector unit, the collector unit is attached to or mounted on a driving unit. In a preferred embodiment a control unit controls the driving unit according to the proposed method to achieve the high operation lifetime of the collector unit. The movement can be controlled to be continuous, preferably with a constant speed, or to be intermittent or stepwise. The control unit controls the movement dependent on for example operation parameters or operation conditions of the device, for example operation time and/or operation voltage and/or operation frequency. In this case the debris load as a function of these parameters should be known. Otherwise or additionally optical measurements in the intermediate focus, in the far field or even further down in the optical path of the irradiation device or lithographic tool using appropriate radiation sensors can be used to control the need for movements and the way how to perform them. In this way inhomogeneities of the light distribution can be used as guidance for the movements to be performed. With the control unit it is thus possible to decide whether or at which times the movements are necessary or in which way and in which speed they have to be made.

As already stated above, the collector unit may be composed of one single or of several independent components which may also be moved separately. The radiation source preferably is a plasma based radiation source, based on a discharge plasma or on a laser plasma. The optical collector unit may comprise at least one grazing incidence collector or may also be formed of at least one near normal incidence collector, in particular collectors for collecting EUV radiation or soft X-rays. Furthermore, it is also possible to perform the proposed method with an irradiation device having more than one radiation source. Also other optical components which are subject to debris degradation may be moved according to the present method.

BRIEF DESCRIPTION OF THE DRAWINGS

The following exemplary embodiments show examples of the present method and device with reference to the accompanying figures without limiting the scope of protection. The figures show:

FIG. 2b a cross section perpendicular to the optical axis of the rotating collector optics of FIG. 2a;

DETAILED DESCRIPTION OF EMBODIMENTS

Figure 1:
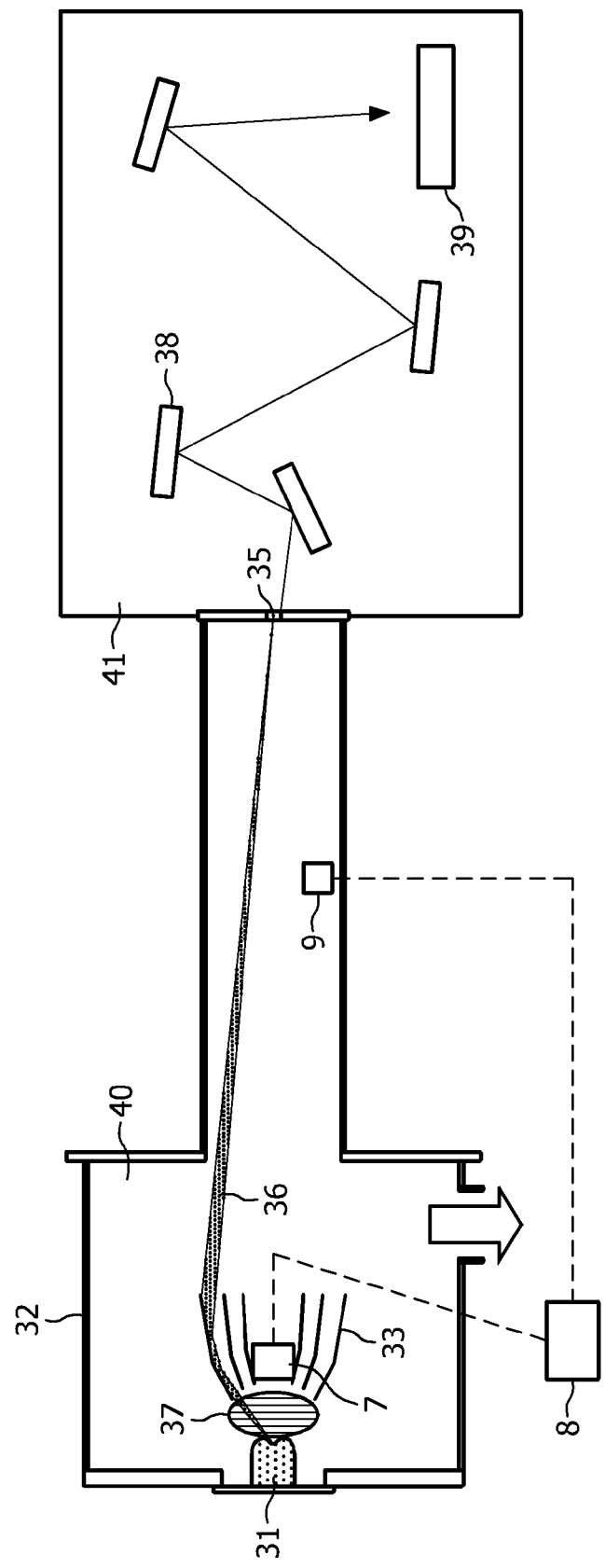
FIG. 1 a schematic configuration of an EUV irradiation unit

A typical construction of a EUV irradiation unit is shown in FIG. 1. The EUV irradiation unit basically consists of the radiation source 31, a collector unit 33 and multilayer mirrors 38 in a vacuum vessel 32. The radiation 36 emitted from the radiation source 31 is collected by the reflective surfaces of the collector unit 33 and focused on an intermediate focus 35. At the position of this intermediate focus 35 an aperture connects this first volume 40 with a second volume 41 of the irradiation device. In this second volume 41 the multilayer mirrors 38 are arranged to guide the radiation from the intermediate focus 35 to the mask and the wafer substrate 39 to be irradiated. In most EUV lithography systems means 37 for debris mitigation are arranged between the radiation source 31 and the collector unit 33. In order to achieve economical operation of the lithography system the debris should be reduced by several orders of magnitude. Such a high mitigation however, is very difficult on the short distance between the radiation source and the collector unit. Therefore there is a high need for suitable methods to elongate the operation lifetime of the collector unit. With the proposed method and irradiation device, which may be constructed like the irradiation device of FIG. 1, the collector unit 33 has to be mounted on an appropriate driving unit 7 which is able to move the collector unit 33 to achieve a more homogeneously distribution of debris or impingement of debris particles on the reflecting surfaces of the collector unit compared to the distribution without such an movement. The following figures schematically show appropriate movements to achieve this homogenization resulting in an increased operation lifetime of the collector unit.

Figure 2A:
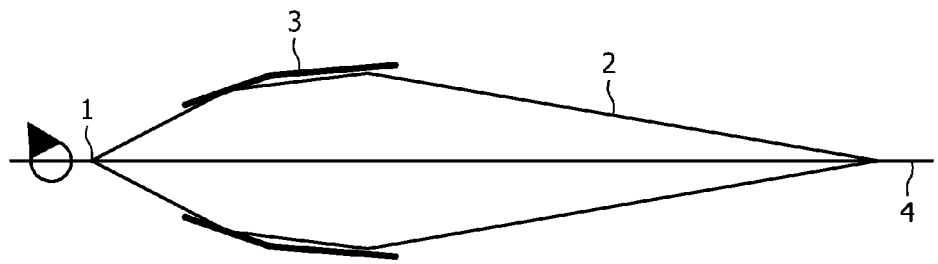
FIG. 2a a schematical view of a cross section parallel to the optical axis of a rotating collector optics of an irradiation unit according to the present invention.

FIG. 2a shows a cross section parallel to the optical axis of a grazing incidence collection optics 3. The radiation source 1 and light beams 2 emitted by the radiation source 1 and reflected at the reflecting surfaces of the collection optics 3 to form a converging light beam are indicated in this figure as well as the optical axis 4 of the collection optics 3. In this example the collection optics 3 is rotated by a stepwise rotation after certain time intervals about the optical axis 4. The direction of rotation is indicated with the arrow in the figure. The rotation angle of each rotation step is defined by the rotational symmetry of the collection optics 3.

Figure 2B:
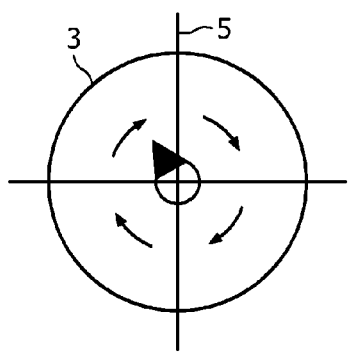

FIG. 2b shows this rotational symmetry in the present example in a cross section perpendicular to the optical axis. The collection optics 3 is supported by a holding structure comprising four spokes 5 in 90° angular distance from each other. Therefore, the rotation steps for rotating the collection optics 3 are steps of 90° or multiples of it to keep the same shadow pattern in the light distribution of the irradiation device.

In the example of FIGS. 2a and 2b only one collector shell is drawn. Nevertheless this rotation also applies for collection optics with two or more collector shells which are typically coaxial as is the usual case.

Figure 3A:
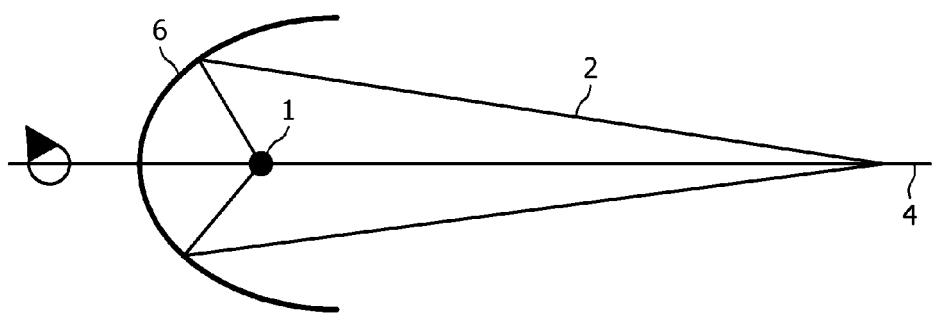
FIG. 3a a schematical view of a cross section parallel to the optical axis of a another type of rotating collector mirror according to the present invention.
Figure 3B:
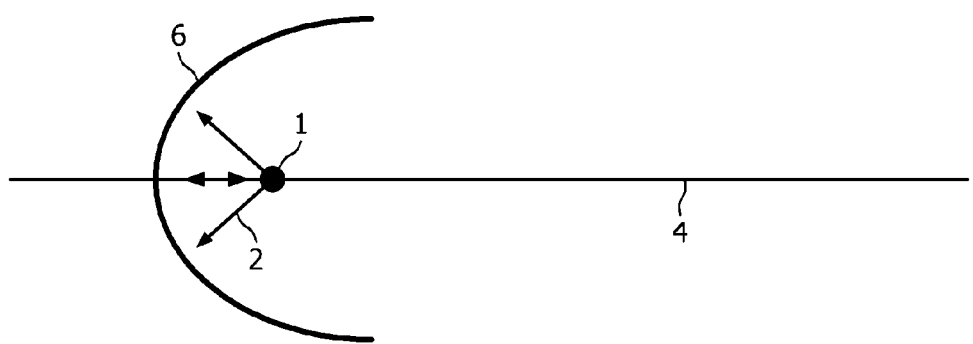
FIG. 3b a schematical view of a cross section parallel to the optical axis of a collector mirror with another type of movement according to the present invention.
Figure 3C:
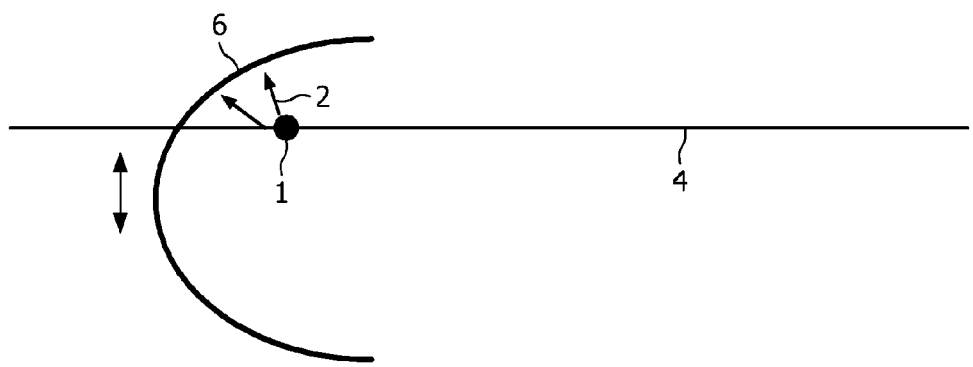
FIG. 3c a schematical view of a cross section parallel to the optical axis of a collector mirror showing a further possible movement according to the present invention.

FIGS. 3a to 3c show the use of another type of collection optics schematically in cross sections parallel to the optical axis. This collection optics is a near normal incidence collection optics 6. The radiation source 1 as well as light beams 2 reflected at the collection optics 6 are indicated in these figures together with the optical axis 4. The figures show different possible movements of the collection optics 6 in order to achieve the advantages of the present invention. The movement can be a permanent rotation as shown with the arrow in FIG. 3a. Such a permanent rotation does not effect the focusing properties of the irradiation device.

The movement can also be a movement in direction of the optical axis 4 as shown in FIG. 3b to achieve for certain time intervals other exposure angles whilst the focusing properties are changed during this time.

FIG. 3c shows a movement of the near normal incidence collection optics 6 perpendicular to the optical axis 4 leading to a concentrated exposure of certain areas of this optical device whilst the focusing properties are changed during this time. The movements with changing focusing properties are preferable made during operation pauses of the irradiation device, i.e. when this device is for example not used for exposing a wafer substrate. Nevertheless, the radiation source should be operated during the rotation of the collector optics in this cases.

In FIG. 1 also schematically a driving unit 7 for the collection unit 33 and a control unit 8 for the control of the driving unit 7 and thus for the movement of the collector unit 33 are indicated. The control unit 8 may control the driving unit based on operational parameters of the device or based on measurement data of optional radiation sensors 9, also indicated in FIG. 1.

While the invention has been illustrated and described in detail in the drawings and forgoing description, such illustration and description are to be considered illustrative or exemplary and not restrictive, the invention is not limited to the disclosed embodiments. The different embodiments described above and in the claims can also be combined. Other variations to the disclosed embodiments can be understood and effected by those skilled in the art in practicing the claimed invention, from a study of the drawings, the disclosure and the appended claims. For example, the construction of the collector unit is not limited to the exemplary construction of the figures. The collector optics may for example also comprise several reflecting shells arranged coaxially to one another. Furthermore, the type of movement of the collector unit is not limited to the disclosed movements. The movement can also be a mixture of translational or rotational movements as far as the selected movement improves the homogeneity of debris impingement on the optical surfaces of the collector unit during freely selectable operation periods. The debris mitigation unit may be any kind of arrangement or means which reduces the amount of substances and/or particles which collide with the optical surfaces of the collector unit. Examples for such means are foil traps, electrical fields, magnetic fields or gas curtains.

In the claims, the word "comprising" does not exclude other elements or steps, and the indefinite article "a" or "an" does not exclude a plurality. The mere fact that measures are recited in mutually different dependent claims does not indicate that a combination of these measures can not be used to advantage. The reference signs in the claims should not be construed as limiting the scope of these claims.

LIST OF REFERENCE SIGNS

1 EUV radiation source
2 EUV light beams
3 grazing incidence collection optics
4 optical axis
5 strokes
6 near normal incidence collection optics
7 driving unit
8 control unit
9 optical sensor
31 radiation source
32 vacuum vessel
33 collector optics
35 intermediate focus
36 radiation path
37 means for debris mitigation
38 multilayer mirrors
39 wafer substrate
40 first volume
41 second volume

The invention claimed is:

1. A method of increasing operational lifetime of an optical collector unit arranged in an irradiation device, said irradiation device comprising a radiation source for emitting extreme ultraviolet radiation or soft X-rays, said radiation source generating substances and/or particles colliding with optical surfaces of said optical collector unit, said optical collector unit forming a radiation beam of a portion of said radiation emitted by said radiation source, and a debris mitigation unit reducing an amount of said substances and/or particles which collide with optical surfaces of the collector unit, the method comprising:

moving said optical collector unit such that deposits or degradation effects caused by collision of said substances and/or particles with said optical surfaces of the collector unit are distributed more homogeneously on said optical surfaces than without such a movement, wherein said collector unit is moved dependent on at least one of
(i) measurement data of at least one optical sensor arranged to measure a light intensity or a light distribution of said radiation beam, (ii) operation time, (iii) operation voltage, and (iv) operation frequency.

2. The method according to claim 1, wherein said collector unit has an optical axis and is rotated around said axis.

3. The method according to claim 1, wherein said collector unit is rotated continuously during operation of the device.

4. The method according to claim 1, wherein said collector unit is rotated stepwise by defined angles during operation or in operation pauses of the device.

5. The method according to claim 1, wherein said collector unit is moved towards said radiation source or in an opposite direction of said radiation source or perpendicular to an optical axis of the collector unit.

* * * * *